(12) United States Patent
Priya

(10) Patent No.: US 7,686,974 B2
(45) Date of Patent: Mar. 30, 2010

(54) HIGH ENERGY DENSITY PIEZOELECTRIC CERAMIC MATERIALS

(75) Inventor: Shashank Priya, Arlington, TX (US)

(73) Assignee: Board of Regents, the University of Texas System, Austin, TX (US)

( * ) Notice: Subject to any disclaimer, the term of this patent is extended or adjusted under 35 U.S.C. 154(b) by 330 days.

(21) Appl. No.: 11/252,923

(22) Filed: Oct. 18, 2005

(65) Prior Publication Data
US 2007/0087930 A1    Apr. 19, 2007

(51) Int. Cl.
C04B 35/493    (2006.01)
H01L 41/187    (2006.01)
(52) U.S. Cl. ................. 252/62.9 PZ; 501/134
(58) Field of Classification Search .......... 252/62.9 PZ; 501/134
See application file for complete search history.

(56) References Cited

U.S. PATENT DOCUMENTS

| | | | |
|---|---|---|---|
| 3,546,120 A * | 12/1970 | Nishida et al. ........ | 252/62.9 R |
| 3,728,263 A * | 4/1973 | Nishida et al. ........ | 252/62.9 PZ |
| 4,467,236 A | 8/1984 | Kolm et al. | |
| 5,801,475 A | 9/1998 | Kimura et al. | |
| 5,977,690 A | 11/1999 | Ellis, II et al. | |
| 6,207,069 B1 * | 3/2001 | Furukawa et al. ..... | 252/62.9 PZ |
| 6,308,356 B1 | 10/2001 | Frederick et al. | |
| 7,239,066 B2 | 7/2007 | Ott et al. | |
| 2005/0017602 A1 | 1/2005 | Arms et al. | |

FOREIGN PATENT DOCUMENTS

| | | |
|---|---|---|
| JP | 11303726 | 11/1999 |
| JP | 2001204507 | 7/2001 |
| JP | 2005237156 | 9/2005 |
| WO | WO 2006/012437 | 2/2006 |

OTHER PUBLICATIONS

Priya, Shashank, et al., Piezoelectric Windmill: A Novel Solution to Remote Sensing, Japan J. Appl. Phys., vol. 44, pp. L104-L107, Dec. 24, 2005.

* cited by examiner

*Primary Examiner*—C. Melissa Koslow
(74) *Attorney, Agent, or Firm*—J. Peter Paredes; Rosenbaum & Silvert, P.C.

(57) ABSTRACT

The present invention includes methods, devices, and compositions having improved piezoelectric characteristics with high energy density. Compositions of the present invention are ceramic materials of the formula: $Pb[(Zr_{0.52}Ti_{0.48})O_3]_{1-x}[(Zn_{1/3}Nb_{2/3})O_3]_x+Mn$, where x is 0.05 to 0.20 and Mn is manganese in a form that is present from about 0.1 to 1.5 wt %. Suitable manganese forms as the starting material include $MnCO_3$, $MnO_2$, MnO, and $Mn_3O_4$. The compositions exhibit a high product of piezoelectric voltage constant and piezoelectric stress constant. The compositions are polycrystalline or textured with a dense microstructure and small grain. The piezoelectric voltage constant and piezoelectric stress constant obtained from such compositions are superior to those of conventional hard or soft ceramics and yield a magnitude product of the piezoelectric voltage constant and piezoelectric stress constant that is significantly higher than those reported in the literature or in available with commercial or conventional ceramic compositions.

17 Claims, 16 Drawing Sheets

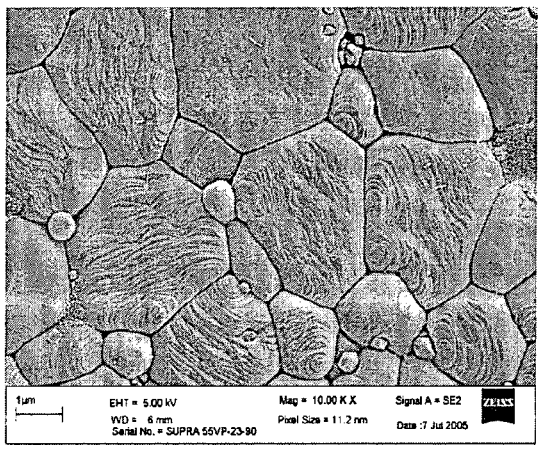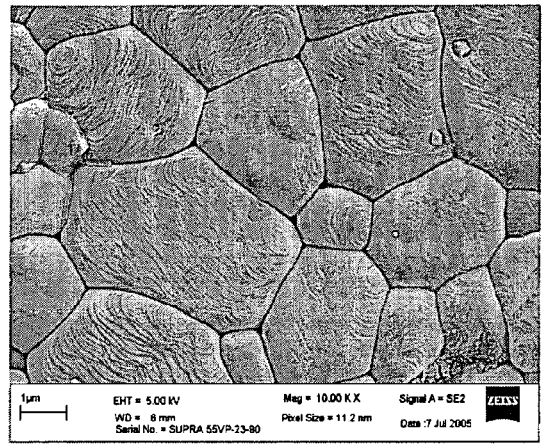
FIG. 4A					FIG. 4B
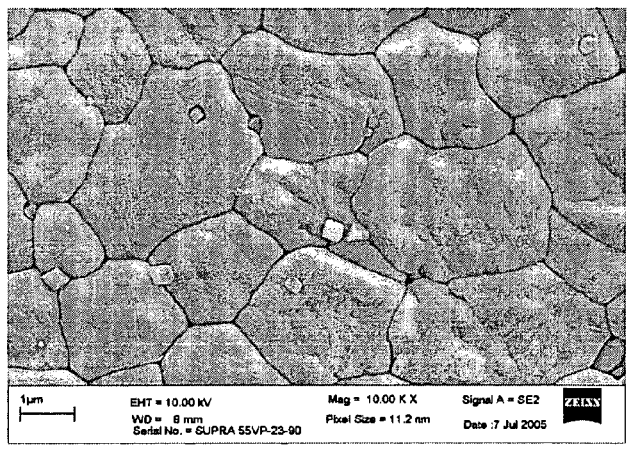
FIG. 4C

HIGH ENERGY DENSITY PIEZOELECTRIC CERAMIC MATERIALS

BACKGROUND OF THE INVENTION

The present invention relates generally to improved ceramic materials with high energy density, in particular, polycrystalline and textured ceramic materials with improved electric and piezoelectric behaviors suitable for harvesting and producing energy and in energy sensing devices.

The search high efficiency smart structures for energy harvesting in both defense and civil applications is ongoing, particularly in the area of small integrated structures. Research efforts have focused on on-site generators for unmanned aerial and water vehicles, hybrid automobiles, smart pocket computers, audio and video devices. Previous efforts have involved generating energy via solar energy, hydrogen fuel cell, thermoelectric devices and photostrictive materials. Unfortunately, integration of these methods with an intended platform of "small-range" and/or "energy-on-demand" has proven to be expensive, tedious as well as technology-driven. A more attractive alternative is using electric power generation using piezoelectric to harvest freely available energy as described herein.

SUMMARY OF THE INVENTION

The present invention solves problems associated with harvesting energy and generating electric energy or power using piezoelectric materials having significant advantages over previously available materials.

Generally, and in one form, the present invention provides a composition having improved piezoelectric characteristics with high energy density and comprising a ceramic material of the formula: $Pb[(Zr_{0.52}Ti_{0.48})O_3]_{1-x}[(Zn_{1/3}Nb_{2/3})O_3]_x$ + Mn, where x=0.05 to 0.2 and Mn is manganese present in one of a number of forms from about 0.1 to 1.5 wt %. Suitable forms of manganese as the starting material include $MnCO_3$, $MnO_2$, MnO, and $Mn_3O_4$, as examples. The compositions exhibit a high product of piezoelectric voltage constant (g) and piezoelectric stress constant (d). The compositions are polycrystalline with a dense microstructure and small grains. For these compositions, the values of $g_{33}$ and $d_{33}$ were found to be at least about $50 \times 10^{-3}$ m$^2$/C and at least about $280 \times 10^{-12}$ C/N, respectively, yielding a magnitude product $d_{33} \cdot g_{33}$ that is significantly higher than the reported values in the literature or obtained from commercially available and conventional hard or soft ceramic compositions. The material constant n is lower with compositions of the present invention as compared with those obtained from conventional hard or soft ceramic materials.

In another form, the present invention provides a method of producing a piezoelectric material with high energy density. The method comprises a two step sintering process for a composition of the present invention. The process provides polycrystalline ceramic composition with low magnitude of material constant n.

Compositions of the present invention are included in energy generators to provide electric power using a piezoelectric material in a number of forms, such as in the form of a piezoelectric transducer. Accordingly, electric power generation with transducers or actuators comprising compositions of the present invention provide useable energy; energy production is based on the composition's direct piezoelectric effect. Combined with wireless transmission, the present invention technology provides a practical solution to near and remote powering of devices, such as sensors and those used in electronics, automotives, optics, communications, medical technology, defense, aeronautics, as examples.

Those skilled in the art will further appreciate the above-noted features and advantages of the invention together with other important aspects thereof upon reading the detailed description that follows in conjunction with the drawings.

BRIEF DESCRIPTION OF SEVERAL VIEWS OF THE DRAWINGS

For a more complete understanding of the features and advantages of the present invention, reference is now made to the detailed. description of the invention along with the accompanying figures in which corresponding numerals in the different figures refer to corresponding parts and in which:

FIG. 4A, B, and C depict representative SEM images of different compositions prepared by the two step sintering process;

DETAILED DESCRIPTION

Figure 1:
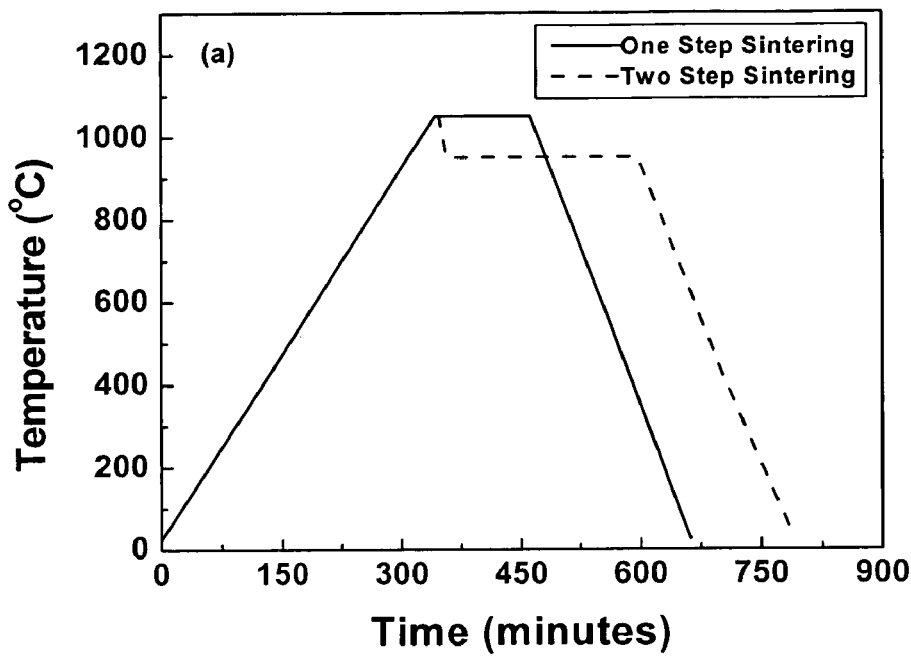
FIG. 1 depicts a temperature versus time profile illustrating the difference between one step and two step sintering in accordance with one aspect of the present invention.

Although making and using various embodiments of the present invention are discussed in detail below, it should be appreciated that the present invention provides many inventive concepts that may be embodied in a wide variety of contexts. The specific aspects and embodiments discussed herein are merely illustrative of ways to make and use the invention, and do not limit the scope of the invention.

In the description which follows like parts may be marked throughout the specification and drawing with the same reference numerals, respectively. The drawing figures are not necessarily to scale and certain features may be shown exaggerated in scale or in somewhat generalized or schematic form in the interest of clarity and conciseness.

The primary factor for the selection of a piezoelectric material for energy harvesting applications is the transduction rate. The magnitude of the transduction is governed by the effective piezoelectric stress constant, d, and the effective piezoelectric voltage constant, g. Using the linear constitutive piezoelectric equations a relation between the energy density of the piezoelectric material and the transduction coefficient (d.g) under an applied stress X can be derived.

The present invention realizes piezoelectric ceramic compositions with a high g constant and a high (d.g) product. Using various material compositions, a solid solution of a such a ceramic composition, such as lead zinc niobate (Pb(Zn$_{1/3}$Nb$_{2/3}$)O$_3$ or PZN), and lead zirconate titanate (Pb(Zr$_{0.52}$Ti$_{0.48}$)O$_3$ or PZT), provide improved coefficients.

Enhancement in the magnitude of the piezoelectric voltage constant uses optimization in the magnitude of the piezoelectric stress constant and dielectric constant. In general, the variation in magnitude of piezoelectric stress constant and dielectric constant is similar and they increase or decrease simultaneously upon modification with dopants or processing technique resulting in minor changes in the magnitude of their ratio. A novel strategy as provided herein is used to obtain large g constants.

The criterion for maximization of the product (d.g) with respect to the microstructure variable x (such as grain size) may be determined as shown in Equation (1) or (2) which is:

$$\frac{\partial}{\partial x}(d \cdot g) = d \cdot \left(\frac{\partial g}{\partial x}\right) + g \cdot \left(\frac{\partial d}{\partial x}\right) \quad (1)$$

$$= 2 \cdot \left(\frac{d}{\varepsilon}\right) \cdot \left(\frac{\partial d}{\partial x}\right) - \left(\frac{d}{\varepsilon}\right)^2 \left(\frac{\partial \varepsilon}{\partial x}\right)$$

$$= 0$$

or $$\frac{\partial (\ln d^2)}{\partial x} = \frac{\partial (\ln \varepsilon)}{\partial x} \Rightarrow d = \varepsilon^{0.5}, \quad (2)$$

where $\varepsilon = \varepsilon_r \varepsilon_o$ and x is the strain.

By differentiating Equation (1) with respect to x and substituting the condition given by Equation (2), it is shown that $$\left(\frac{\partial^2}{\partial x^2}\right)(d \cdot g) = \left(\frac{\partial \varepsilon}{\partial x}\right)^2 \frac{1}{\varepsilon^{1.5}} \left(1 - \frac{1}{\varepsilon^{0.5}}\right) < 0. \quad (3)$$

The condition given by Equation (2) represents the maximum magnitude of the product (d.g). The condition given by Equation (2) is also expressed as Equation (4), which is $$|d| = \varepsilon^n \quad (4).$$

Using Equation (4) the maximum magnitude of the product (d.g) is given as:

$$\text{Max}(d.g) = \varepsilon^{2n-1} \quad (5).$$

The constant n is related to the optimum piezoelectric voltage constant, g, by Equation (6) as $$n = 1 + \left[\frac{\ln(g)}{\ln(\varepsilon)}\right]. \quad (6)$$

For practical polycrystalline ceramic materials the magnitude of n lies in the range of 1.1 to 1.3. For example, a conventional hard ceramic, such as APC 841 (APC International, Mackeyville, Pa.), has a $d_{33}=300\times 10^{-12}$ C/N and relative dielectric constant $\varepsilon_{33}/\varepsilon_o=1350$. Substituting these values in Equations (4) to (6), the magnitude of n for APC 841 is approximately 1.202. Similarly, for a conventional soft ceramic, such as APC 856 with $d_{33}=620\times 10^{-12}$ C/N and relative dielectric constant $\varepsilon_{33}/\varepsilon_o=4100$, the magnitude of n is approximately 1.237.

Equation (4) represents a deterministic rule for realizing the high energy density piezoelectric materials. According to this equation a giant enhancement in the magnitude of the g constant will be obtained by reducing the magnitude of the n. As the magnitude of n decreases and approaches the theoretically minimum possible value of 0.5 the magnitude of product (d.g) reaches the maximum possible magnitude of unity. In order to obtain large magnitude of the product (d.g), compositions of the present invention are tailored by modifying the dopant or processing technique such that the change in piezoelectric and dielectric constant leads to a decrement in the magnitude of constant n.

For high energy density piezoelectric materials of the present invention, a starting material is initially synthesized using a conventional mixed oxide processing as disclosed in, for example, Priya et al., *Appl. Phys. Lett.* 2003:83, 5020, and incorporated herein by reference. Suitable starting materials are hard ceramic materials, such as $Pb(Zr, Ti)O_3$ and $Pb(Zn, Nb)O_3$, suitable for high power applications with a large mechanical coupling factor (k), mechanical quality factor ($Q_m$) and piezoelectric constant (d).

High energy density polycrystalline ceramic composition of the present invention are then prepared using a preferred sintering profile as disclosed herein. Suitable ceramic compositions of the present invention comprise $xPZN-(x-1)PZT+yMn$ or $xPb(Zn_{1/3}Nb_{2/3})O_3-(x-1)Pb(Zr_{0.52}Ti_{0.48})O_3+$ wt % y manganese (Mn). Suitable forms of the starting material for manganese include $MnCO_3$, $MnO_2$, $MnO$, and $Mn_3O_4$, as examples.

EXAMPLES

A preferred sintering profile was obtained by preparing a polycrystalline ceramic composition comprising 0.9 $Pb(Zr_{0.52}Ti_{0.48})O_3-0.1$ $Pb(Zn_{1/3}Nb_{2/3})O_3+0.5$, 0.7 and 0.9 wt % manganese carbonate ($MnCO_3$) using two different sintering profiles: a single step process (a conventional process that includes sintering at about 1050° C. for 2 hrs) and a two step process. For the two step sintering, samples were kept at about 900° C. or higher for at least about five minutes followed by a temperature drop, wherein the drop was from 25 degrees to over 100 degrees. In one example, samples were kept at 1000° C. for at least about five minutes followed by a temperature drop to about 925° C. which was held for about 4 hours. In another example, samples were first kept at 950° C. followed by a temperature drop to about 900° C. In another example, samples were first kept at 1050° C. followed by a temperature drop to about 950° C. A heating rate of 3° C./min and cooling rate of 7° C./min was typically used with these examples; however, alternate rates are suitable. FIG. 1 shows the different temperature-time profiles for a representative single step and representative two step sintering process.

The two step sintering process provided particular advantages, such as a smaller grain size and grains that exhibit a denser crystalline microstructure. The one step sintering process was not suitable for producing small grain sizes because in the one step process the final stage of sintering was always accompanied by rapid grain growth. In addition, for one step sintering, capillary driving force for sintering and grain growth produced very large grains. In contrast, the two step sintering suppressed the final stage grain growth and small grain sizes were achieved by controlling the kinetics of grain boundary diffusion and grain boundary migration.

Figure 2:
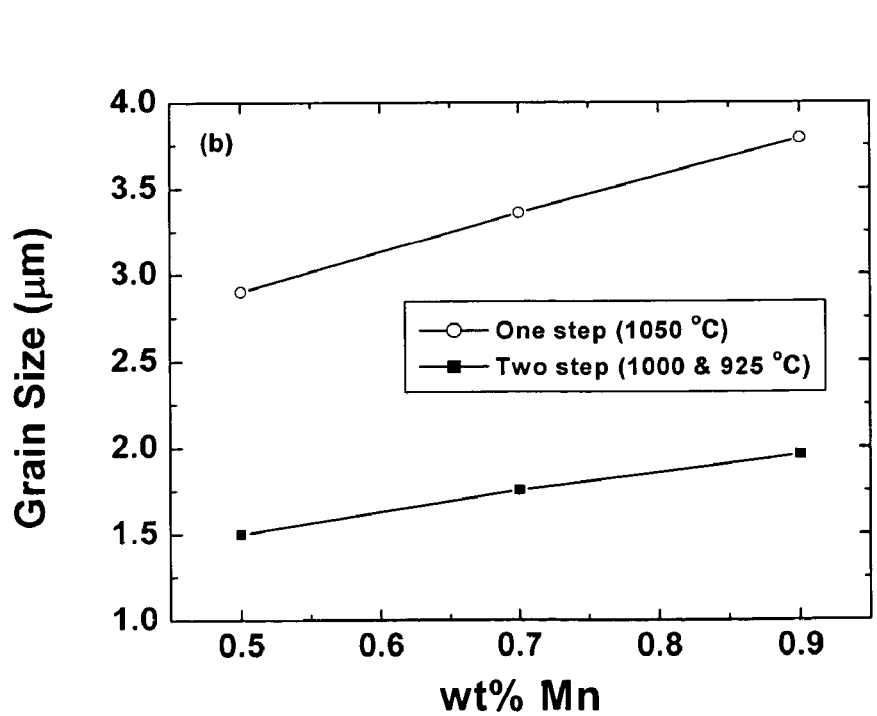
FIG. 2 depicts grain size variations as a function of the Mn concentration for compositions prepared by one and two step sintering in accordance with another aspect of the present invention.
Figure 3A:
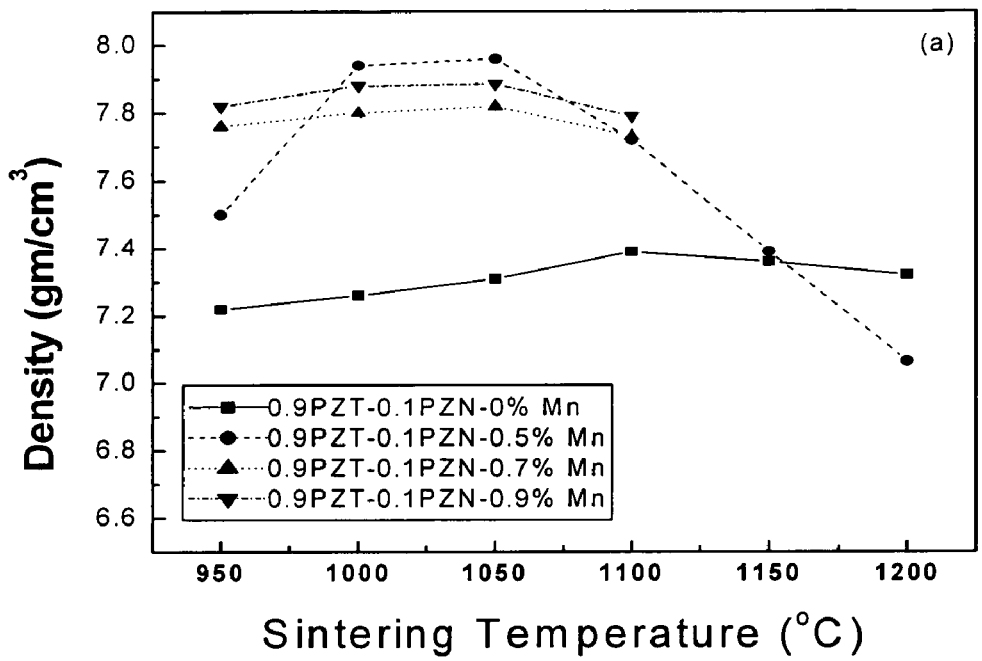
FIG. 3A depicts density variations as a function of sintering temperature for compositions prepared by one step sintering.
Figure 3B:
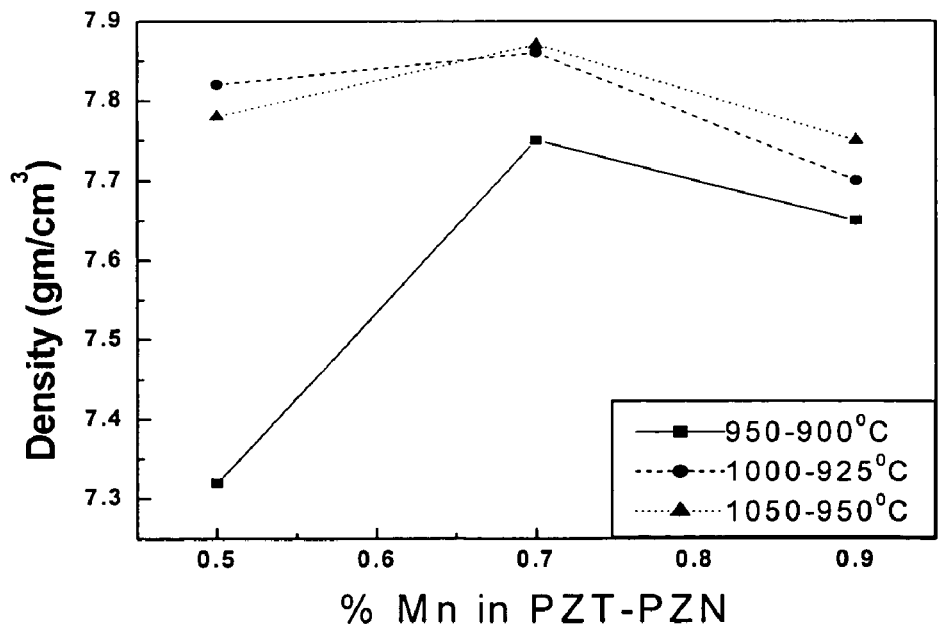
FIG. 3B depicts density variations as a function of % Mn for compositions prepared by two step sintering.

FIG. 2 illustrates grain size variations as a function of the Mn concentration for one step versus two step sintering. FIG. 3A shows representative grain densities as a function of temperature for a one step sintering process. This was compared to representative grain densities achieved with various two step processes using differing temperature drops in which for compositions comprising either 0.9 $Pb(Zr_{0.52}Ti_{0.48})O_3-0.1$ $Pb(Zn_{1/3}Nb_{2/3})O_3+0.5$, 0.7 or 0.9 wt % $MnCO_3$, as shown in FIG. 3B. Additional evidence was obtained from SEM micrographs of various samples fabricated via two step sintering incorporating a temperature drop of 1000° C. and 925° C. that illustrate the uniform grain size after two-step sintering (FIGS. 4A-4C). XRD patterns showed only perovskite phase peaks (data not shown). For FIG. 4A, grains are from 0.9 PZT-0.1 PZN +0.5% Mn. For FIG. 4B, grains are from 0.9 PZT-0.1 PZN+0.7% Mn and for FIG. 4C, 0.9 PZT-0.1 PZN+ 0.9% Mn was used. Together, it is apparent that smaller grain size and denser microstructure is achieved through two step sintering as compared with one step sintering.

For compositions comprising $xPb(Zn_{1/3}Nb_{2/3})O_3-(x-1)Pb(Zr_{0.52}Ti_{0.48})O_3+$ wt % y(Mn), the density was recorded at about 7.9 gm/cc which is approximately 98% of the theoretical density (calculated to be 8.02 gm/cc). Piezoelectric measurements were performed with such compositions using an Ag/Pd electrode, in which the electrode was applied on the samples and fired at 850° C. for one hour. Electrode samples were then poled by applying a dc field of 3 kV/mm for 20 minutes in a silicone oil bath at 80° C. The piezoelectric constant was measured by APC YE 2730A $d_{33}$ meter. Dielectric constant was measured using HP 4274A LCR meter (Hewlett Packard Co. USA). Several batches of the above compositions were prepared and four samples from each batch were poled for piezoelectric measurement. Measurements of each sample were repeated at least three times for consistency.

Figure 5A:
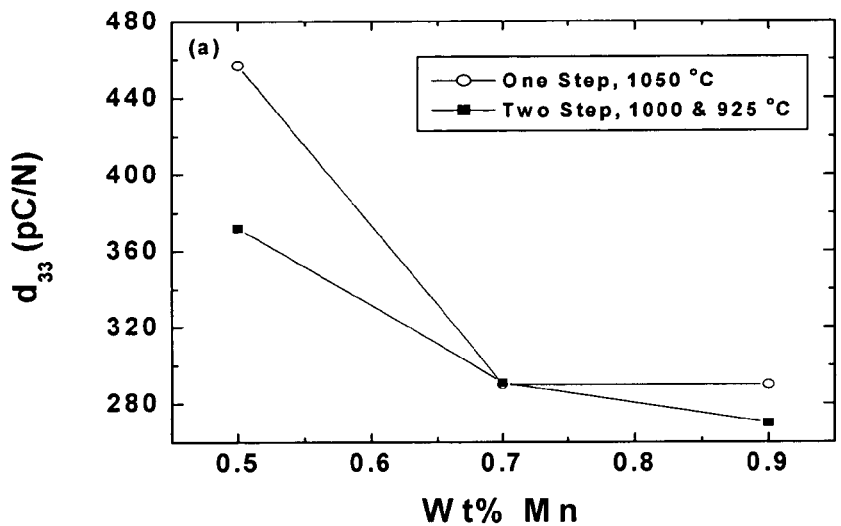
FIG. 5 depicts variations in piezoelectric properties as a function of the Mn concentration for two types of sintering profiles illustrating (A) piezoelectric stress constant $d_{33}$, (B) dielectric constant, $\in_{33}/\in_o$ and (C) piezoelectric voltage constant, $g_{33}$.
Figure 5B:
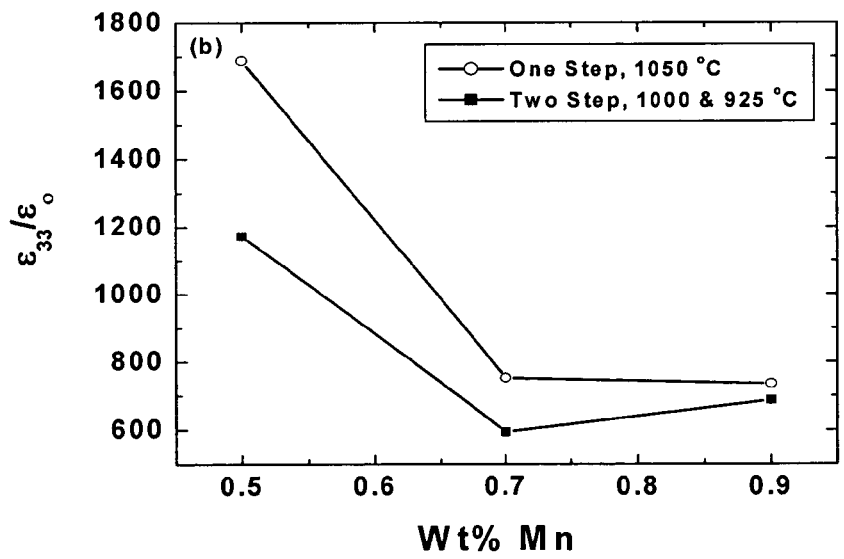
Figure 5C:
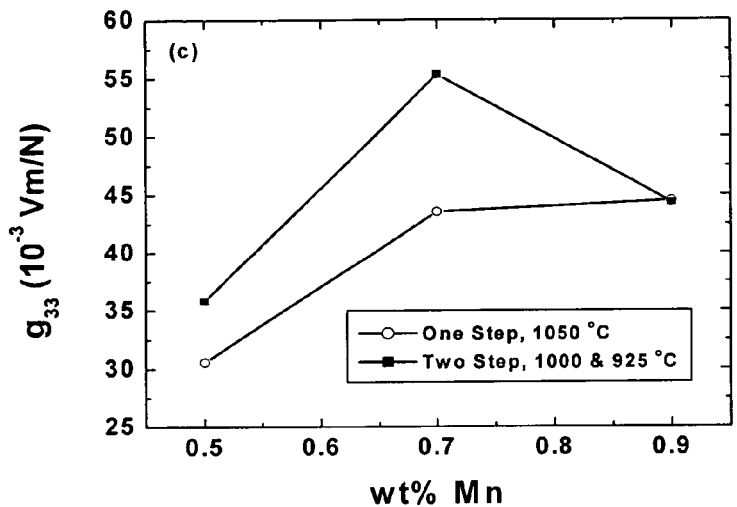

For compositions of 0.9 $Pb(Zr_{0.52}Ti_{0.48})O_3-0.1$ $Pb(Zn_{1/3}Nb_{2/3})O_3+x$ wt % $MnCO_3$ prepared by both a one step sintering process and a two step sintering process, FIG. 5A depicts a generalized representation of longitudinal mode piezoelectric stress constant ($d_{33}$) as a function of the Mn concentration and FIG. 5B depicts a generalized representation of dielectric constant ($\in_{33}/\in_o$) as a function of the Mn concentration. FIG. 5C shows a generalized representation of magnitude of the g constant calculated using the data in FIGS. 5A and 5B.

Figure 6:
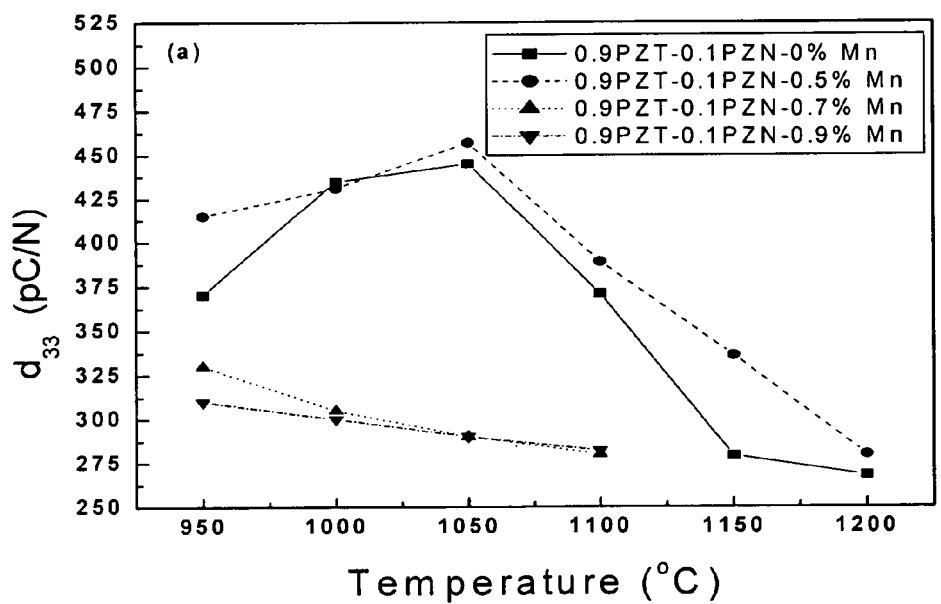
FIG. 6 depicts $d_{33}$ as a function of sintering temperature for compositions prepared by one step sintering.
Figure 7:
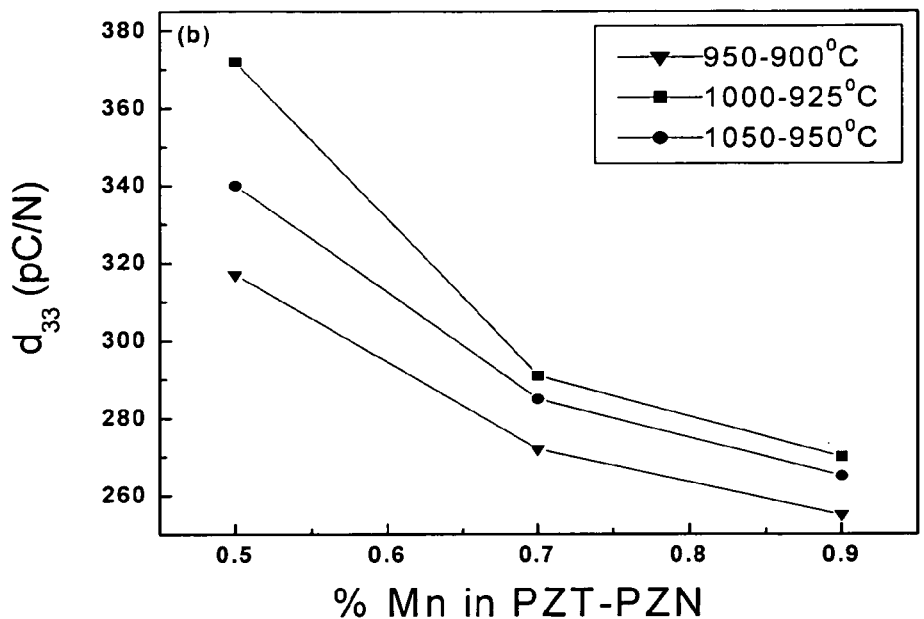
FIG. 7 depicts $d_{33}$ as a function of % Mn for compositions prepared by two step sintering.
Figure 8:
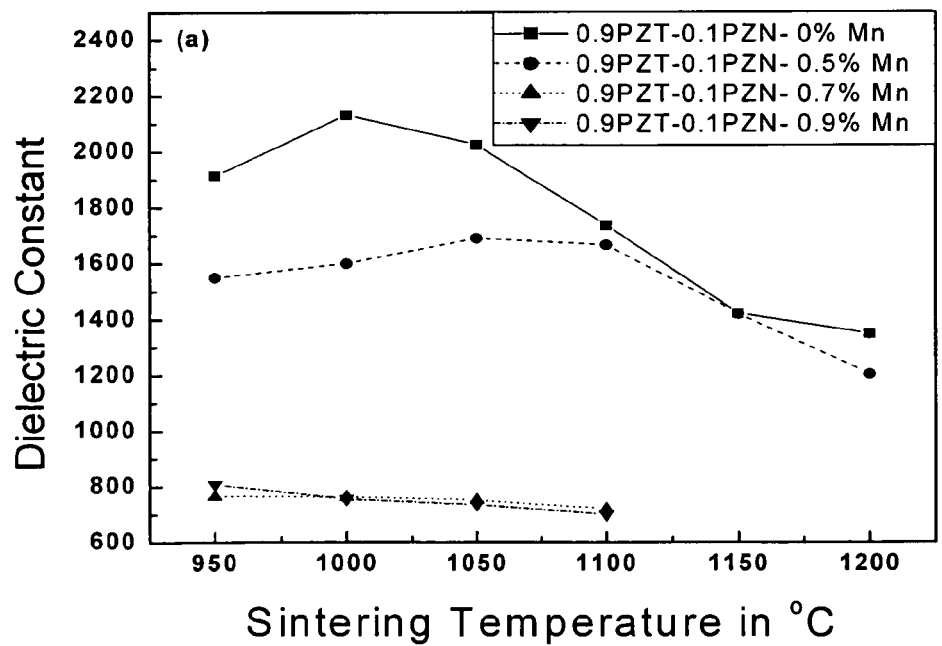
FIG. 8 depicts the dielectric constant $\in_r$ as a function of sintering temperature for compositions prepared by one step sintering.
Figure 9:
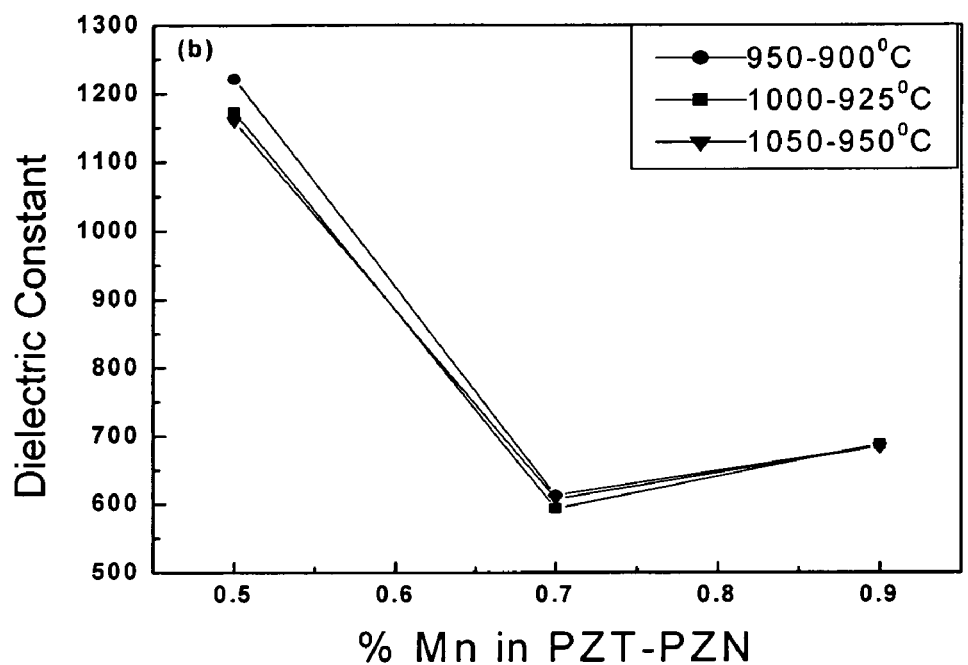
FIG. 9 depicts the dielectric constant $\in_r$ as a function of % Mn for compositions prepared by two step sintering.

Both FIGS. 5A and 5B illustrate that the magnitude of $d_{33}$ and $\in_{33}/\in_o$ decreases with increasing Mn concentration. Examples of such decrements are further illustrated in FIGS. 6-9. FIG. 6 shows the piezoelectric constant $d_{33}$ as a function of sintering temperature for compositions prepared by the one step sintering. FIG. 7 shows the piezoelectric constant $d_{33}$ as a function of % Mn for compositions prepared by the two step sintering process. FIG. 8 depicts dielectric constant $\in_r$ as a function of sintering temperature for compositions prepared by the one step sintering) and FIG. 9 depicts dielectric constant $\in_r$ as a function of the % Mn for compositions prepared by two step sintering.

Such decrements in the magnitude of piezoelectric and dielectric properties are, in part, the outcome of mechanisms involving $Mn^{2+}$ ions. The first includes the effect of $Mn^{2+}$ ions that occupy the B-site. The ions act as a hardener and create oxygen vacancies which pin the domain wall motion, thus, leading to the observed decrements in the magnitude of piezoelectric and dielectric constant. The second includes the involvement of $Mn^{2+}$ ions in the promotion of grain growth and in providing larger sized grains that enhance domain mobility, thus, leading to an increment in the magnitude of piezoelectric and dielectric constant. With the different sintering processes (one step versus two step) the difference in the magnitude of the properties for the same composition become apparent because each process has a different effect on defect concentration and distribution, grain size, homogeneity and apparent density.

Figure 10:
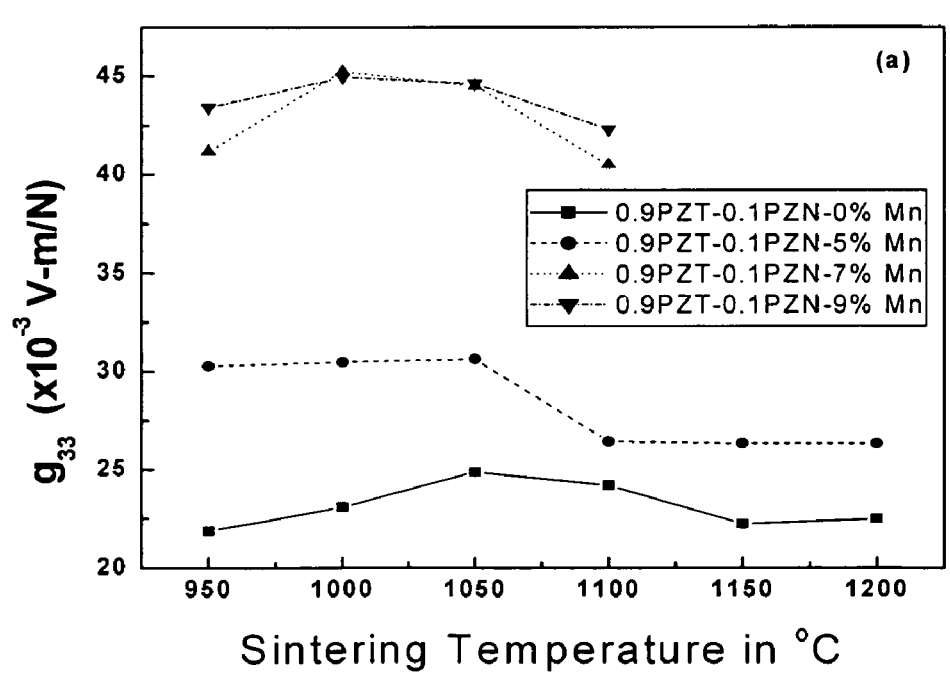
FIG. 10 depicts $g_{33}$ as a function of sintering temperature for compositions prepared by one step sintering.
Figure 11:
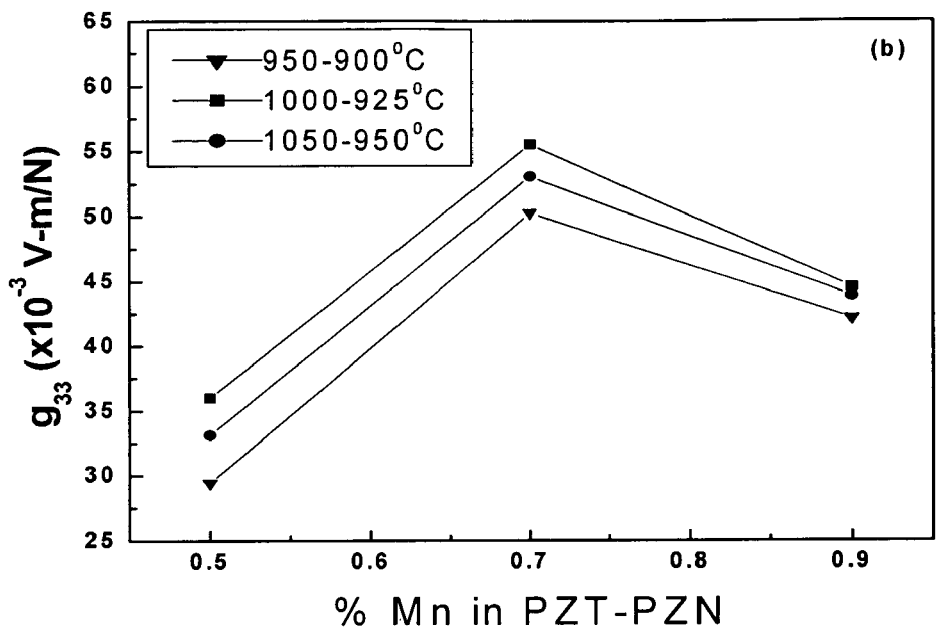
FIG. 11 depicts $g_{33}$ as a function of % Mn for compositions prepared by two step sintering.

Typically, as shown in FIG. 5C, a large g constant of about 55.56 is obtained for a PZT-PZN composition with 0.7 wt % Mn fabricated via the two step sintering process and having a magnitude of $d_{33}$ equal to 291 pC/N and a dielectric constant of $\in_{33}/\in_o$ equal to 591.55. To date, this appears to be one of the highest if not the highest magnitude for a g constant reported for a polycrystalline piezoelectric ceramic. Further examples of the piezoelectric voltage constant $g_{33}$ as a function of sintering temperature (FIG. 10) for various compositions prepared by the one step sintering and as a function of % Mn (FIG. 11) for various compositions prepared by the two step sintering are provided.

Figure 12:
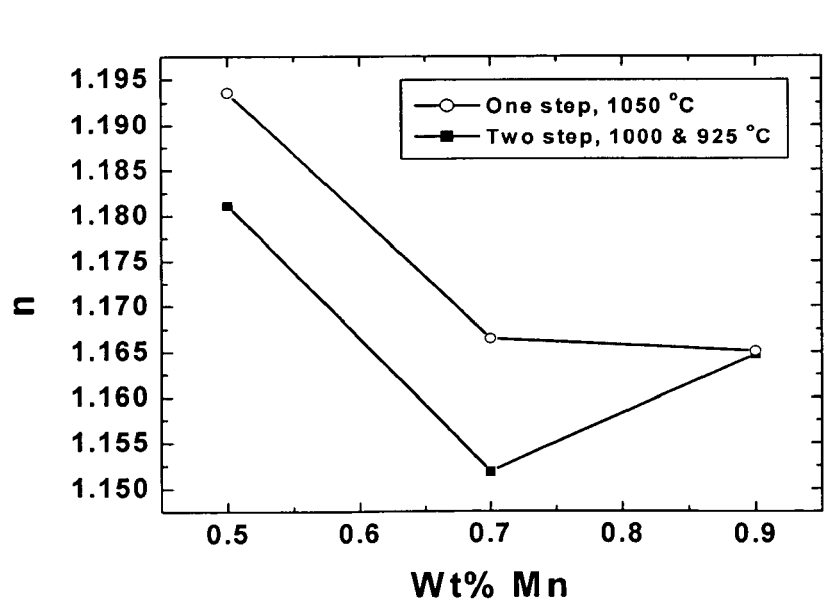
FIG. 12 depicts n constant variations for two types of sintering profiles in accordance with one aspect of the present invention.

The calculated values of n as a function of Mn concentration using data from FIGS. 5A and 5B are shown in FIG. 12. As is evident in FIG. 12, a small magnitude of n corresponds with a ceramic having a large magnitude g constant. Specifically, for the PZT-PZN compositions of the present invention with 0.7 wt % Mn, the value of n was found to be about 1.151. This value is significantly smaller than those observed for conventional hard and soft ceramics and, thus, represents an improved material with an optimized magnitude for obtaining high product (d.g) as predicted by Equation (4). It should be mentioned that there are extreme cases to the rule given by Equation (4) which include (a) quartz single crystal ($d_{33}$=2.3 pC/N, $\in_{33}/\in_o$=5, $g_{33}$=51.9, n=1.124); (b) polyvinylidene fluoride piezoelectric polymer ($d_{33}$=33 pC/N, $\in_{33}/\in_o$=13, $g_{33}$=286.7, n=1.054); and (c) relaxor piezoelectric single crystals such as PZN–7% PT ($d_{33}$=2500 pC/N, $\in_{33}/\in_o$=6700, $g_{33}$=42.1, n=1.190). For these extreme cases, even though the magnitude of n is consistent with that predicted by Equation (4), the magnitude of the product (d.g) shows a smaller or larger value due to large variations between the piezoelectric and dielectric constant in the materials identified above.

Figure 13:
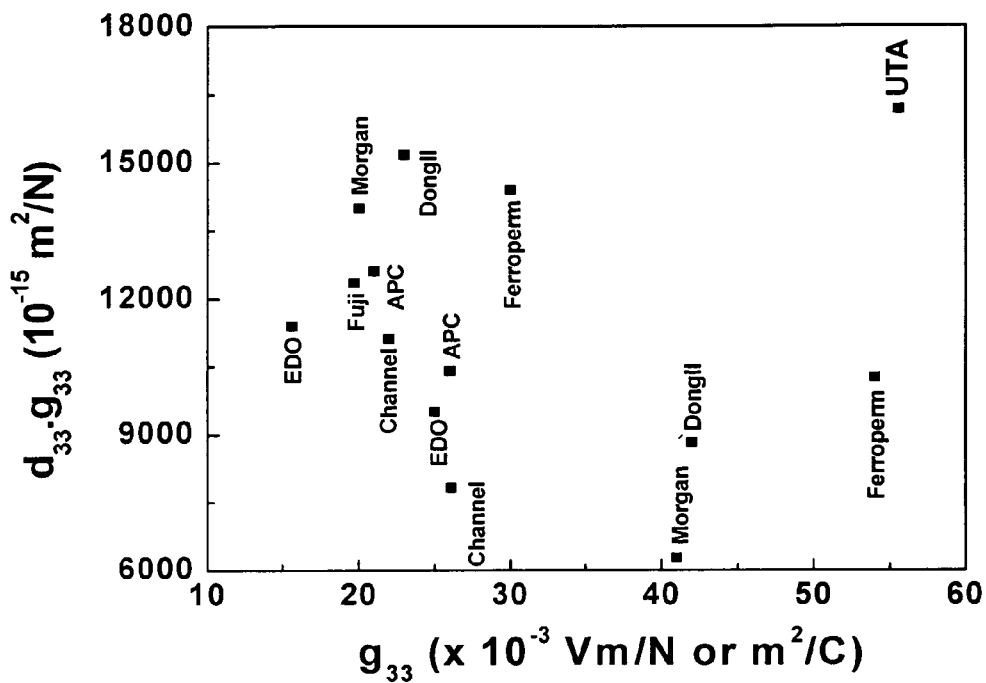
FIG. 13 depicts a comparison of the magnitude of product $(d_{33} \cdot g_{33})$ as a function of $g_{33}$ for various materials in accordance with yet another aspect of the present invention.

FIG. 13 compares a composition of the present invention (denoted UTA, a composition comprising 0.9 Pb($Zr_{0.52}Ti_{0.48}$)$O_3$-0.1 Pb($Zn_{1/3}Nb_{2/3}$)$O_3$+0.7 wt % $MnCO_3$ including $d_{33} \cdot g_{33}$=16168×10$^{-15}$ m$^2$/N, $g_{33}$=55.56×10$^{-3}$ m$^2$/C, n=1.151) with commercially available compositions, including those from companies marked on the figure such as Ferroperm™(PZT lead zirconate titanate, 0.9 Pb($Zr_{0.52}Ti_{0.48}$)$O_3$-0.1 Pb($Zn_{1/3}Nb_{2/3}$)$O_3$) (Pz24, 0.9 Pb($Zr_{0.52}Ti_{0.48}$)$O_3$-0.1 Pb($Zn_{1/3}Nb_{2/3}$)$O_3$: $d_{33} \cdot g_{33}$=10260×10$^{-15}$ m$^2$/N, $g_{32}$=54×10$^{-3}$ m$^2$/C, n =1.150), Fuji Ceramics Corporation (C-8, 0.9 Pb($Zr_{0.52}Ti_{0.48}$)$O_3$-0.1 Pb($Zn_{1/3}Nb_{2/3}$)$O_3$: $d_{33} \cdot g_{33}$=12351×10$^{-15}$m$^2$/N, $g_{33}$=19.7×10$^{-3}$m$^2$/C, n=1.225), EDO Corporation (EC-98, 0.9 Pb($Zr_{0.52}Ti_{0.48}$)$O_3$-0.1 Pb($Zn_{1/3}Nb_{2/3}$)$O_3$: $d_{33} \cdot g_{33}$=11388×10$^{-15}$ m$^2$/N, $g_{33}$=15.6×10$^{-3}$m$^2$/C, n =1.249; EC-65, 0.9 Pb($Zr_{0.52}Ti_{0.48}$)$O_3$-0.1 Pb($Zn_{1/3}Nb_{2/3}$)$O_3$: $d_{33} \cdot g_{33}$=9500×10$^{-15}$ m$^2$/N, $g_{33}$=25 ×10$^{-3}$m$^2$/C, and n=1.205), Morgan Electro Ceramics (PZT-507, 0.9 Pb($Zr_{0.52}Ti_{0.48}$)$O_3$-0.1 Pb($Zn_{1/3}Nb_{2/3}$)$O_3$: $d_{33} \cdot g_{33}$=14000×10$^{-15}$ m$^2$/N, $g_{33}$=20×10$^{-3}$ m$^2$/C, n =1.226), APC International (APC 855, 0.9 Pb($Zr_{0.52}Ti_{0.48}$)$O_3$-0.1 Pb($Zn_{1/3}Nb_{2/3}$)$O_3$: $d_{33} \cdot g_{33}$=12600×10$^{-15}$ m$^2$/N, $g_{33}$=21×10$^{-3}$ m$^2$/C, n=1.22; APC 850, 0.9 Pb($Zr_{0.52}Ti_{0.48}$)$O_3$-0.1 Pb($Zn_{1/3}Nb_{2/3}$)$O_3$: $d_{33} \cdot g_{33}$=10400×10$^{-15}$ m$^2$/N, $g_{33}$=26×10$^{-3}$ m$^2$/C, n=1.203), Dongil Ceramics Co. (D211, 0.9 Pb($Zr_{0.52}Ti_{0.48}$)$O_3$-0.1 Pb($Zn_{1/3}Nb_{2/3}$)$O_3$: $d_{33} \cdot g_{33}$=8820×10$^{-15}$ m$^2$/N, $g_{33}$=42×10$^{-3}$ m$^2$/C, n=1.166), and Channel Industries (5600 Navy, 0.9 Pb($Zr_{0.52}Ti_{0.48}$)$O_3$-0.1 Pb($Zn_{1/3}Nb_{2/3}$)$O_3$: $d_{33} \cdot g_{33}$=11110×10$^{-15}$ m$^2$/N, $g_{33}$=22×10$^{-3}$ m$^2$/C, n=1.217; 5400 Navy, 0.9 Pb($Zr_{0.52}Ti_{0.48}$)$O_3$-0.1 Pb($Zn_{1/3}Nb_{2/3}$)$O_3$: $d_{33} \cdot g_{33}$=7830×10$^{-15}$ m$^2$/N, $g_{33}$=26.1×10$^{-3}$ m$^2$/C, n=1.199).

From FIG. 13, it is evident that compositions of the present invention provide improved characteristics from those commercially available, including superior magnitude of piezoelectric voltage constant and product (d.g). The high magnitude of transduction coefficient (d.g) of the present compositions are obtained by adjusting the magnitude of n related to piezoelectric and dielectric constant through Equation (4). Accordingly, the present invention provides materials suitable for piezoelectric energy harvesting applications.

Figure 14:
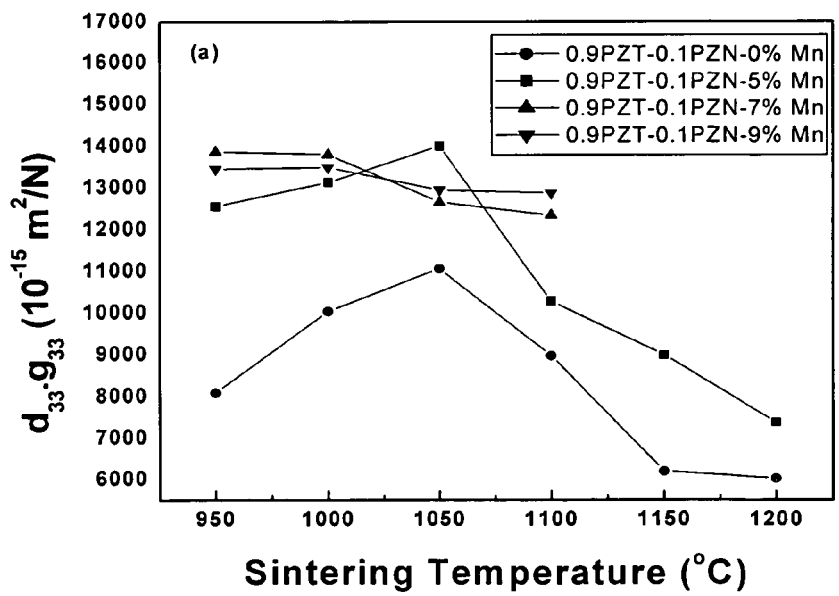
FIG. 14 depicts $d_{33} \cdot g_{33}$ as a function of sintering temperature for compositions prepared by one step sintering.
Figure 15:
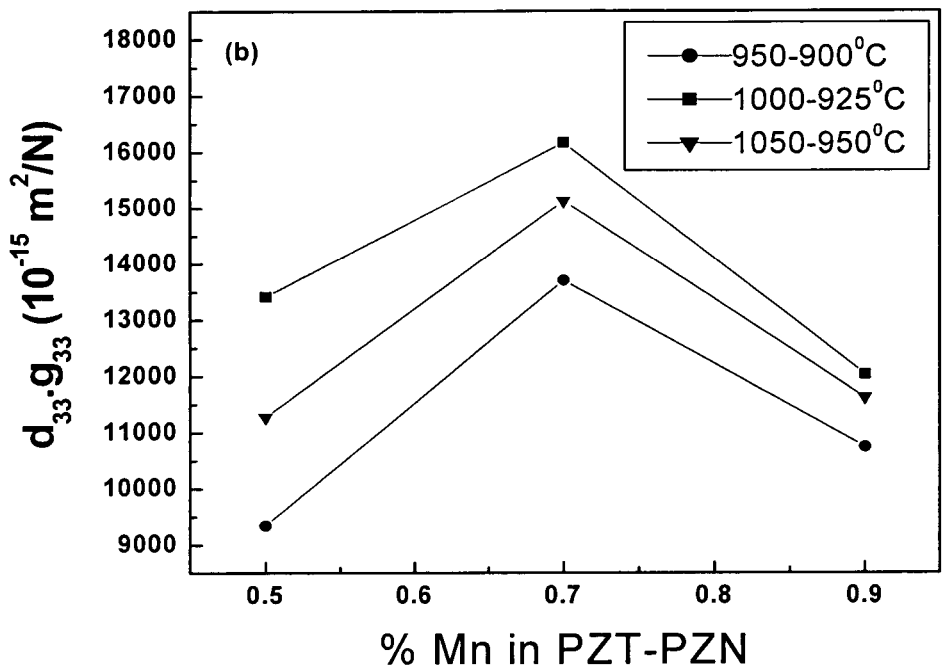
FIG. 15 depicts $d_{33} \cdot g_{33}$ as a function of % Mn for compositions prepared by two step sintering.

Further examples of the energy density parameter $d_{33} \cdot g_{33}$ for compositions of the present invention are shown in FIGS. 14 and 15, in which compositions are prepared by a one step process (FIG. 14) or a two step process (FIG. 15). FIG. 14 depicts $d_{33} \cdot g_{33}$ as a function of sintering temperature and FIG. 15 depicts $d_{33} \cdot g_{33}$ as a function of % Mn. In another example, assuming the magnitude of applied stress is equal to one-sixth of the compressive strength for the piezoelectric ceramic (approximately 100 MPa) then, when using Equation (7), the energy density for a composition of the present will be 80.84 mJ/cm$^3$. A value much higher than other forms of transductions, such as electromagnetic transduction and electrostatic transduction.

Figure 16:
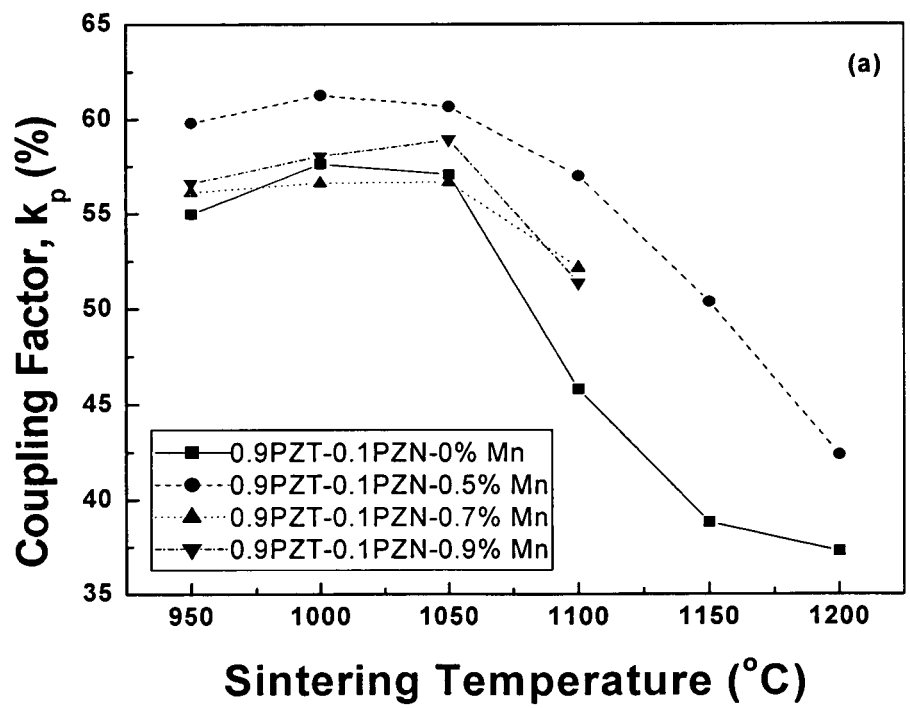
FIG. 16 depicts coupling factor $k_p$ as a function of sintering temperature for compositions prepared by one step sintering.
Figure 17:
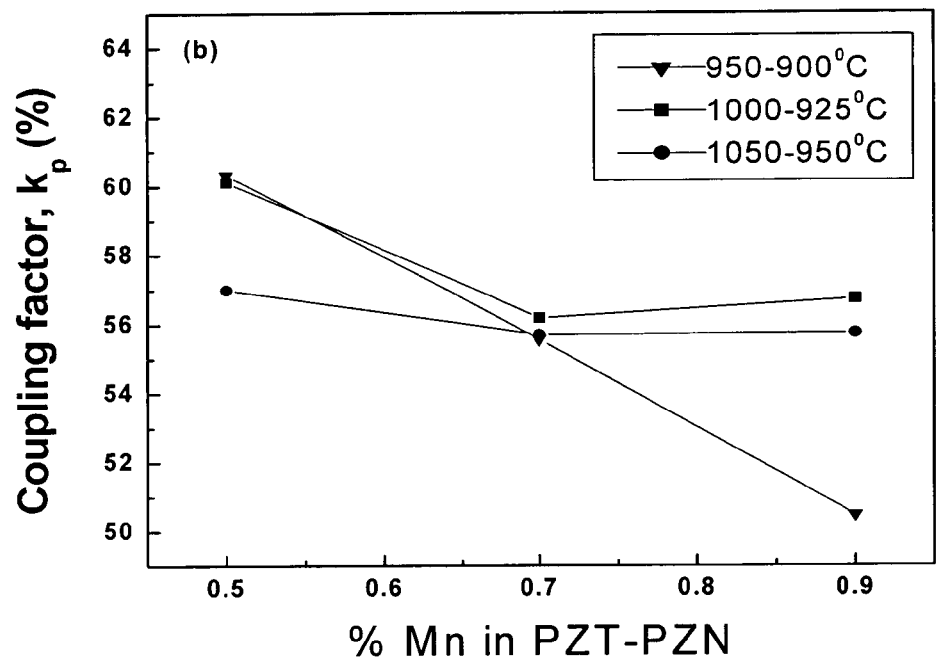
FIG. 17 depicts coupling factor $k_p$ as a function of % Mn for compositions prepared by two step sintering.

Compositions of the present invention are useful for high power applications due to their large mechanical coupling factor (k), mechanical quality factor ($Q_m$) and piezoelectric constant (d). Representative examples of the large coupling factor $k_p$ for compositions of the present invention are shown in FIGS. 16 and 17, in which compositions are prepared by a one step process (FIG. 16) or a two step process (FIG. 17). For compositions prepared with one step sintering, variations in $k_p$ as a function of sintering temperature are depicted in FIG. 16. For compositions prepared with two step sintering, variations in $k_p$ as a function of % Mn are depicted in FIG. 17.

As discussed herein, one fundamental factor for obtaining a giant product (d.g) from polycrystalline piezoelectric ceramics of the present invention is the maximum magnitude of the product (d.g) given by the relation $\in^{2n-1}$, where n is a constant having the lower bound of 0.5. Large enhancements in the magnitude of g are obtained by reducing the value of n. For example, a polycrystalline ceramic of the composition 0.9 Pb($Zr_{0.52}Ti_{0.48}$)$O_3$–0.1 Pb($Zn_{1/3}Nb_{2/3}$)$O_3$+0.7 wt % Mn having a magnitude of n which is 1.151 provides for a very large product (d.g) of 16168×10$^{-15}$ m$^2$/N.

Figure 18:
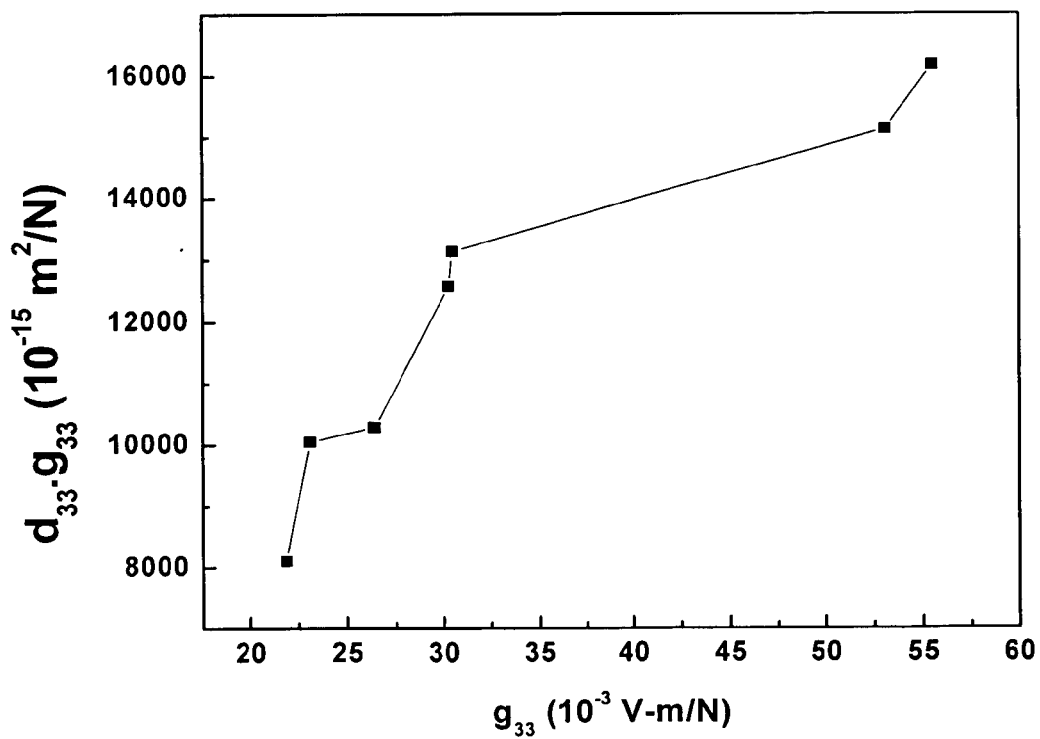
FIG. 18 depicts $d_{33} \cdot g_{33}$ versus $g_{33}$ for different composition fabricated in UTA.

FIG. 18 depicts $d_{33} \cdot g_{33}$ versus $g_{33}$ for different compositional variations of the initial UTA composition, in which UTA was a composition comprising 0.9 Pb($Zr_{0.52}Ti_{0.48}$)$O_3$–0.1 Pb($Zn_{1/3}Nb_{2/3}$)$O_3$+0.7 wt % $MnCO_3$. The compositional differences included variations in Mn content from 0.1 to 1.5 wt %. Thus, with the present invention, simple changes in sintering temperature, Mn content and/or ceramic content (e.g., PZN, PZT) provide for improved values of $d_{33}g_{33}$ and/or $g_{33}$ as compared with conventional ceramics, as needed.

Compositions of the present invention are well suited for energy harvesting and energy sensing applications. For example, compositions of the present invention may play a role in electric power generation using piezoelectric, in which electric power generation using piezoelectric may involve: (a) trapping mechanical AC stress from an available source and applying it to a piezoelectric transducer; (b) converting mechanical energy into electrical energy using direct piezoelectric effect and/or (c) processing and storage of the electrical energy.

In another example, electric power-generation may use wind energy because wind provides a constant source of mechanical energy as opposed to other sources that are often random and difficult to control. In one form of the present invention, compositions of the present invention are arranged as a bimorph transducer so as to provide piezoelectric effects through an energy generator structure resembling a windmill. A piezoelectric bimorph transducer structure is used; however, other transducer structures may be contemplated. Here, the bimorphs are circumferentially arranged and using a camshaft gear mechanism, an oscillating torque is generated through the flowing wind and applied on the actuators.

Figure 19:
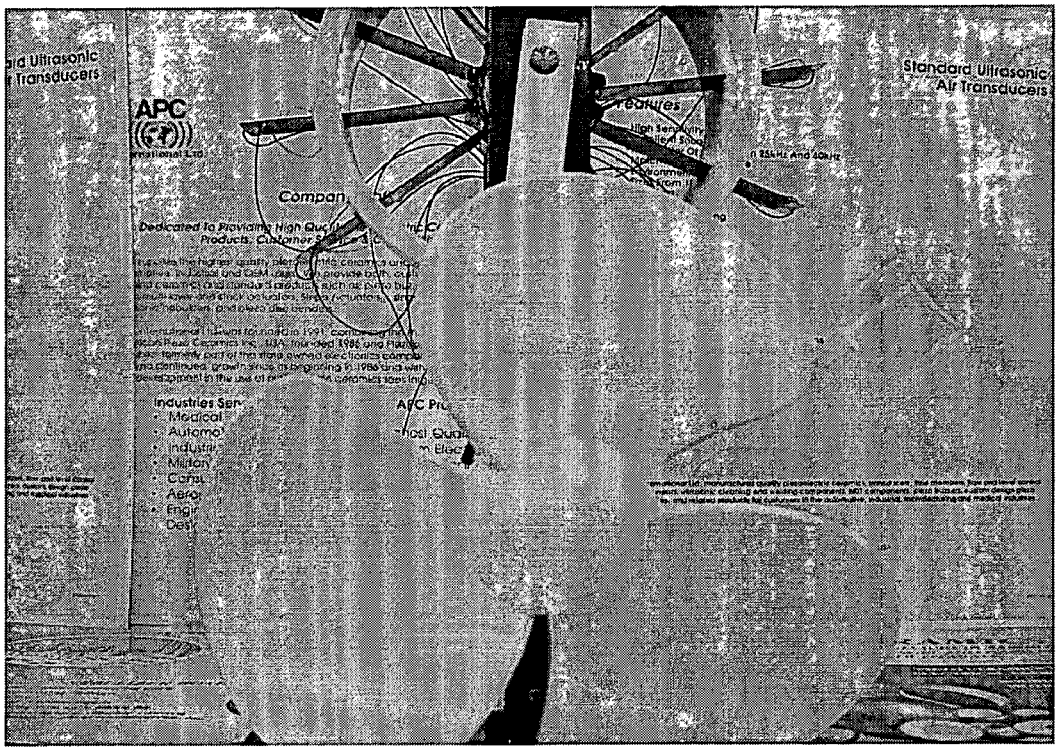
FIG. 19 depicts an image of a fabricated prototype of an energy generator in accordance with one aspect of the present invention.
Figure 22:
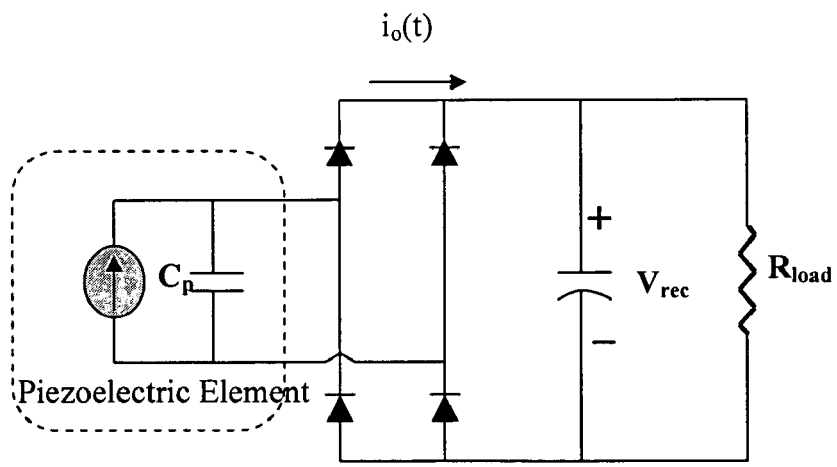
FIG. 22 are examples of energy output from eleven bimorphs connected and showing (A) output voltage waveform across a 4.6 kΩ load and frequency of 4.2 Hz. and (B) rectified output voltage as a function of frequency set at 6 Hz with a load of 4.6 kΩ.
Figure 20:
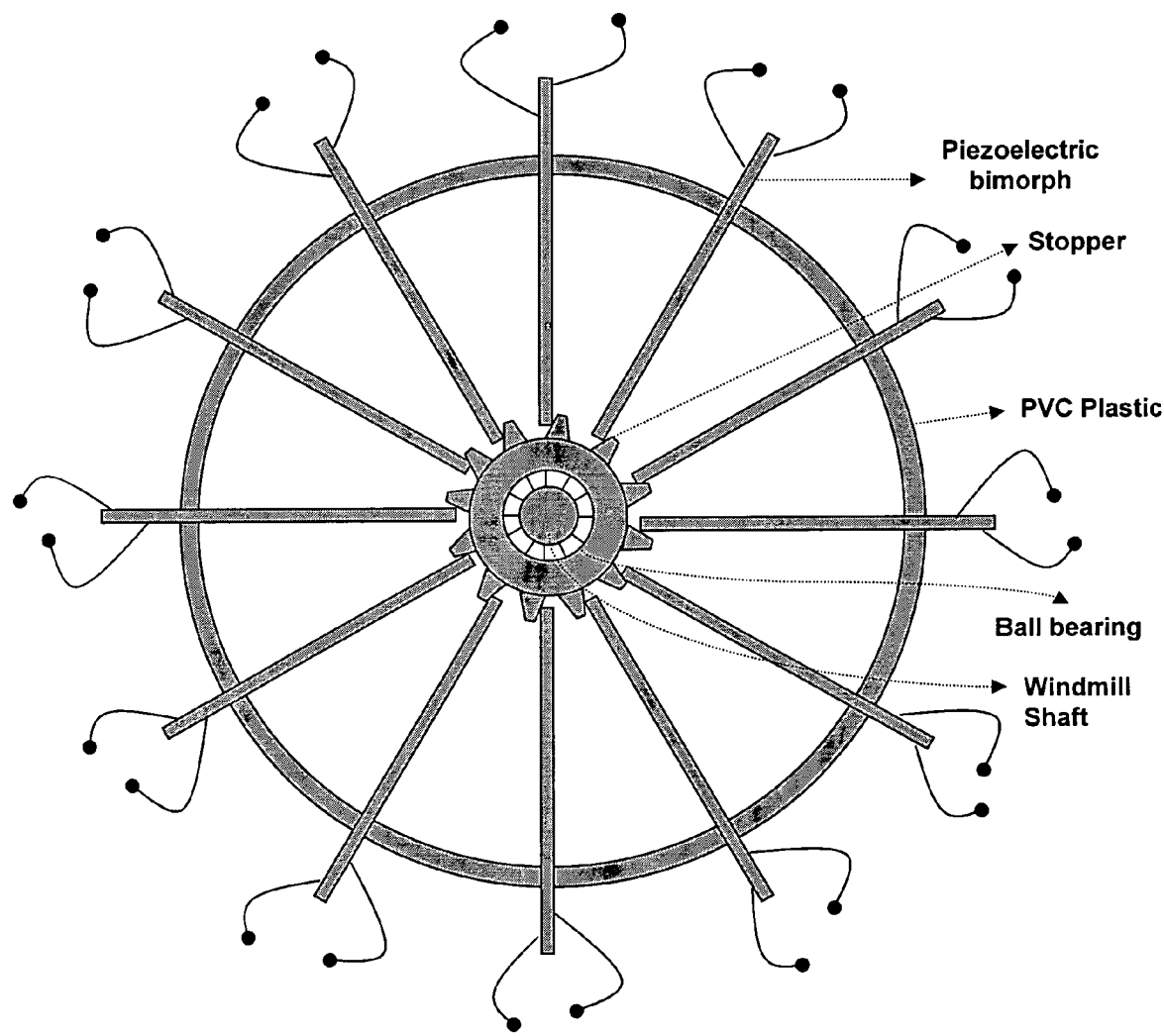
FIG. 20 depicts a schematic of the piezoelectric bimorph arrangement in an energy generator in accordance with another aspect of the present invention.
Figure 21A:
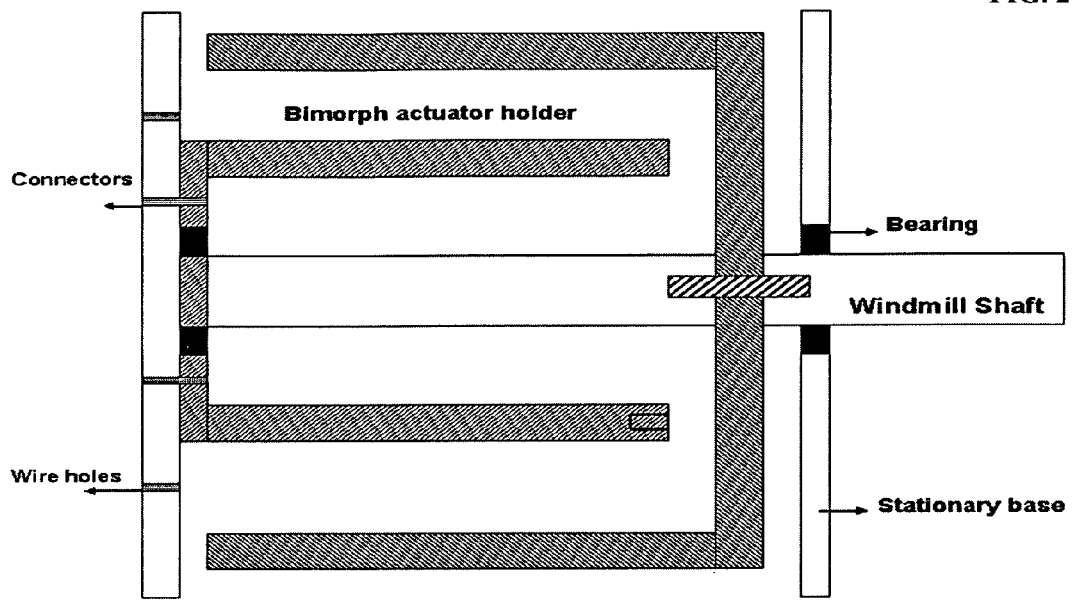
FIG. 21 depicts a schematic of an energy generator structure including examples of (A) a bimorph actuator holder and assembly mount on a rotating shaft, and (B) cross-section of a fan-assembly, hanging weight and cam-shaft mechanism for generating the oscillatory motion in accordance with still another aspect of the present invention.
Figure 21B:
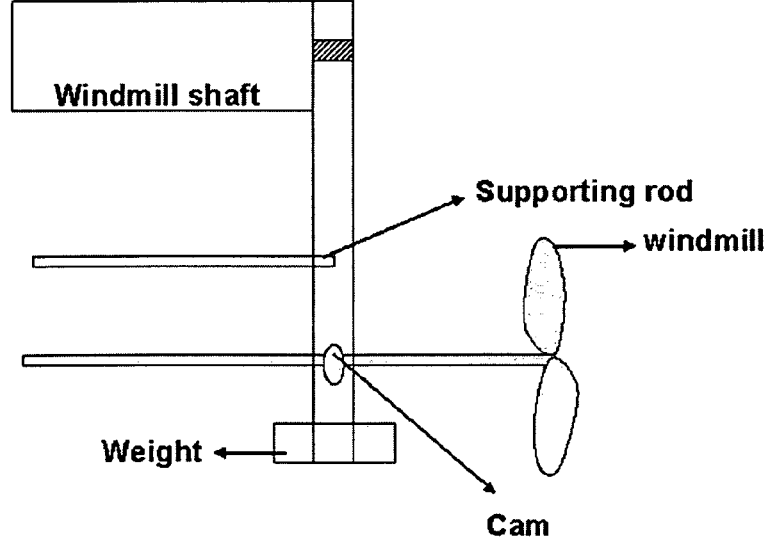

A working prototype is shown in FIG. 19. along with several schematics shown in FIGS. 20-21. This working prototype was fabricated with 12 bimorphs (60×20×0.5 mm$^3$) having a preload of 23.5 gm. Under a nominal torque level corresponding to normal wind flow and oscillating frequency of 6 Hz, a power of 10.2 mW was successfully measured across a load of 4.6 kΩ after rectification. By addition of a DC-DC converter, energy harvesting is improved by a factor of 4 with an efficiency of between 74 to 88%. Further simplifying the energy harvesting circuitry as shown in FIG. 22 may provide even further improvements. For example, the matching load is decreased by at least 100 times and may be further reduced by increasing the number of bimorphs in the windmill. The electrical energy generated provided by such a prototype as described herein is stored in the capacitor or in miniaturized Li-batteries, as examples, and transmitted wirelessly to power various remote devices including sensors for weather monitoring and/or structural health monitoring, accelerometers, strain gages, thermal sensors, switches and alarms, as examples, all of which require power in the range of 10-50 mW. Power is readily controlled by adjusting the number of bimorphs in the windmill. The prototype such as the one described herein may thus be combined with wireless transmission and provide a practical solution to large scale and remote powering of sensors and/or communication devices.

In still another example, a theoretical model for determination of generated electric power from piezoelectric bimorph transducers in low frequency range far from the piezoelectric resonance is provided. The model is divided into two parts. In the first part the open circuit voltage response of the transducer under the ac stress is computed based on the bending beam theory for bimorph. In the second part, the open circuit voltage acts as the input to the equivalent circuit of the capacitor connected across a pure resistive load. The theoretical model was verified by comparing it with the measured response of another prototype windmill comprising 10 piezoelectric bimorph transducers that operated with a wind speed of 1-12 mph. Each bimorph was approximately 60×20×0.6 mm³ with a free length of 53 mm. The resonance frequency and capacitance for this size of bimorph was measured as 65 Hz and 170 nF, respectively. The oscillatory motion is generated using the cam-shaft gear mechanism (see FIGS. 20, 21A and 21B) with a continuous back and forth oscillation of bimorph between two stoppers that continuously generates electricity. A power of 7.5 mW at the wind speed of 10 mph was measured across a matching load of 6.7 kΩ. The theoretical model was found to give very accurate prediction of the generated power and matching load and an excellent matching was found with the experimental results. The theoretical approach provided a determinitistic measure of the characteristic of the piezoelectric device consisting of piezoelectric bimorphs.

The structure and frame-work of this piezoelectric windmill example is similar to that of a conventional windmill except it has active piezoelectric blades (similar to that shown in FIGS. 20-21). As the wind flows through the windmill the active blades oscillate in turn producing electricity. The power generation from the piezoelectric bimorphs loaded in the cantilever form as in the case of windmill can be modeled using the bending beam theory developed by Timoshenko (Timoshenko, S., *J. Opt. Soc. Am.* 1925;11;233; Moulson, A. J. and Herbert, J. M., 2003, Electroceramics, John Wiley & Sons Inc., N.J., USA, both incorporated herein by reference).

Figure 23:
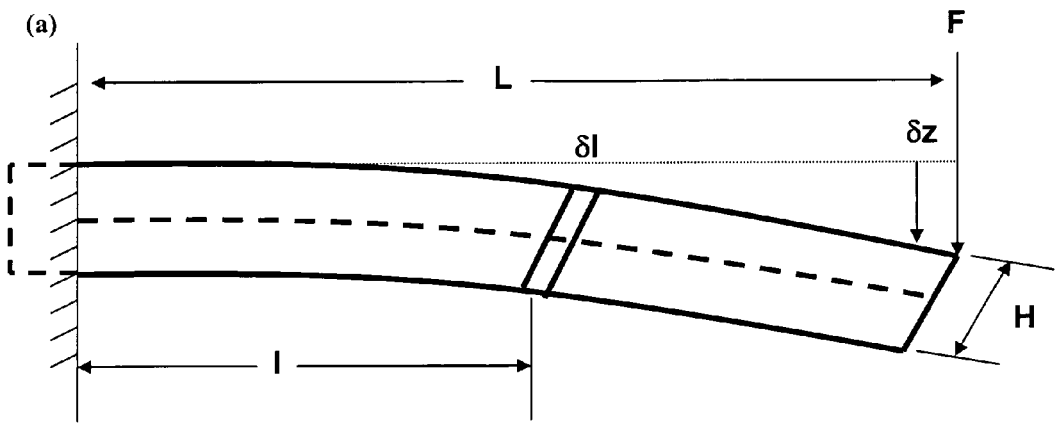
FIG. 23 is a schematic of a model for a piezoelectric electric energy generator structure of the present invention showing strain in a bent rectangular section cantilever for width w and thickness H.

FIG. 23 shows a schematic of cantilever loading of a bimorph where a force F produces a bending moment varying linearly along the length of the beam. The bending moment is maximum at the fixed end and zero at the free end. The electromechanical effect in the piezoelectric take place at constant electric displacement (D).

Figure 24:
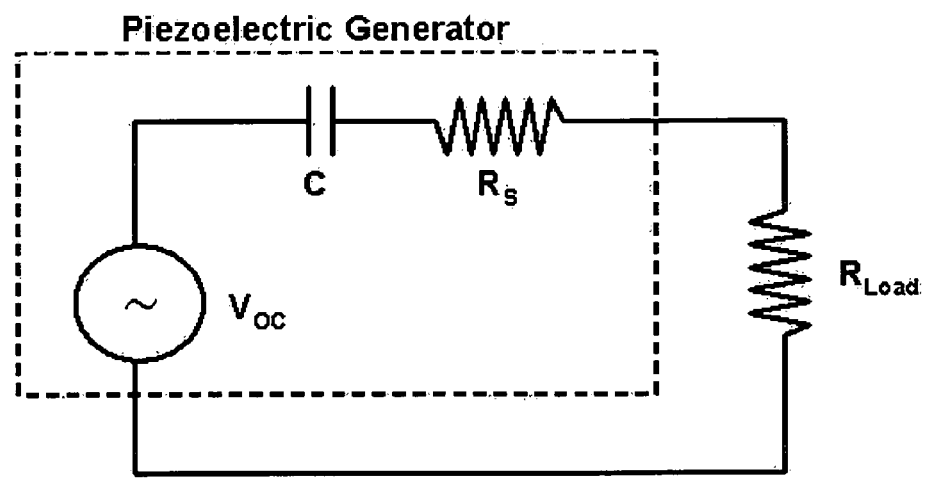
FIG. 24 depicts a schematic of an equivalent circuit representation of a piezoelectric generator in accordance with one aspect of the present invention

The load dependence of the piezoelectric generator can be computed by using the equivalent circuit representation similar to that shown in FIG. 24. This equivalent circuit is only valid in the frequency range far from the resonance. In this circuit the voltage source is taken to be the open circuit voltage across the bimorph. The voltage across the load may be expressed as:

$$V_{Load} = V_{OC} \left| \frac{R_{Load}}{R_{Load} + \frac{1}{j\omega C} + R_S} \right|, \quad (7)$$

where $R_S$ is the series resistance and C is the damped capacitance of the bimorph. The average power delivered to the load may be found using expression:

$$P = \frac{V_{Load}^2}{2R_{Load}}. \quad (8)$$

The power reaches maximum at an optimum load ($R_{Load}^{opt}$) which for the equivalent circuit shown in FIG. 24 is given as:

$$R_{Load}^{opt} = \left| R_S + \frac{1}{j\omega C} \right|. \quad (9)$$

With piezoelectric ceramic compositions of the present invention provided in a piezoelectric generator structure as described above and using the equations provided herein, power was found to increase almost linearly with frequency over the whole range. The magnitude of matching load dropped with increasing frequency but saturated at higher frequencies. Overall, variations in the saturated frequency of the piezoelectric generator structure described herein was found to have a linear relationship with wind speed.

Figure 25A:
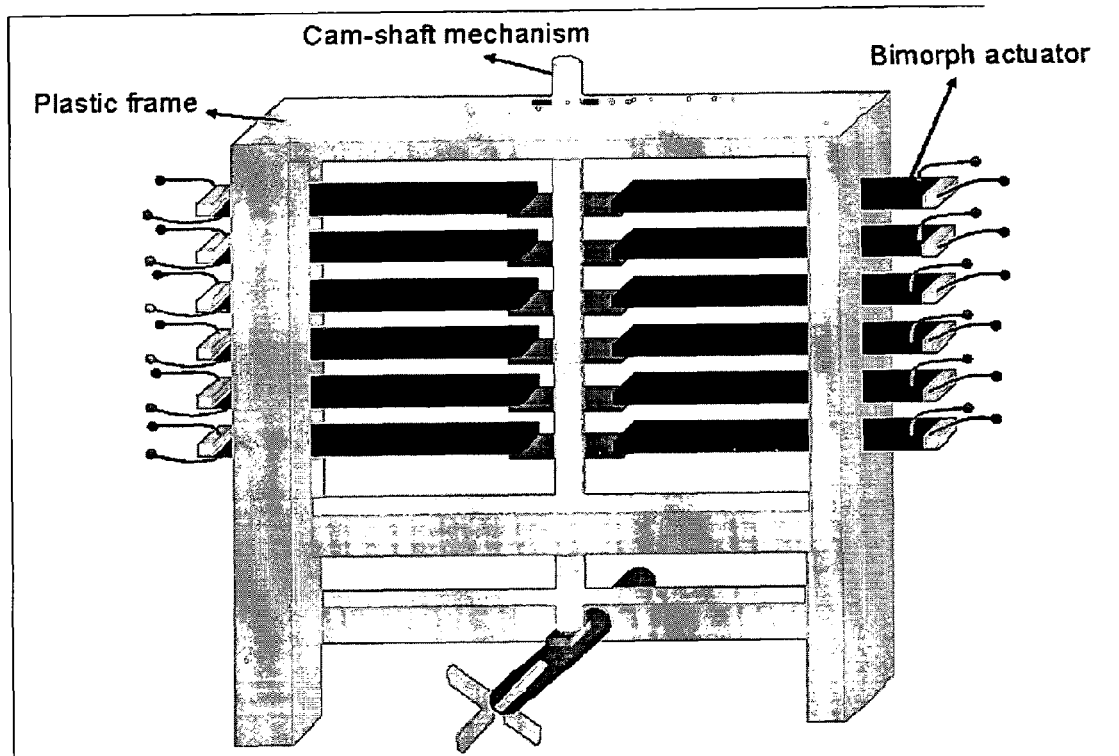
FIG. 25 shows a representative electric energy generator, including (A) a schematic diagram with an arrangement of bimorph transducers, (B) a picture of a fabricated prototype, and (C) loading of the bimorphs using rectangular hooks.
Figure 25B:
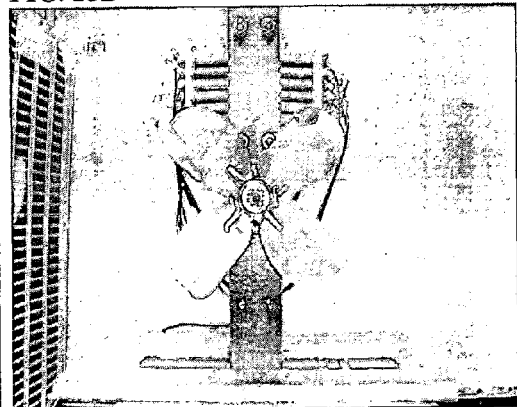
Figure 25C:
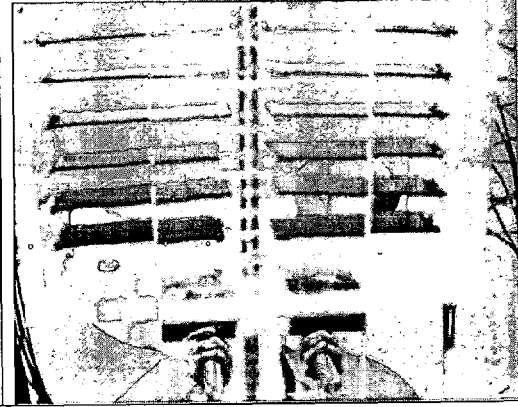

In yet another example, an extremely cost effective electric energy generator capable of converting wind energy into electric energy using piezoelectric bimorph actuators was prepared on a small scale as shown in FIGS. 25A, 25B, and 25C. The total dimensions of this electric energy generator was 5.08×11.6×7.7 cm³. A piezoelectric transducer was selected as the energy converter. The rectangular box-shaped body of the overall structure was made using plastic (approximately 3.2 mm thick). Twelve bimorph transducers were arranged in six rows and two columns separated from each other by a gap of 6 mm through the slit. Slits were made on two opposite faces of the body so that two columns and six rows of bimorph actuators/transducers could be inserted. Each row of bimorph actuators was separated from each other by a gap of about 6 mm and the two columns of bimorphs were separated from each other by a gap of about 6.35 mm. The dimensions of each individual bimorph was 60×20×0.6 mm³ with a free length of 55 mm. In between the two columns a cylindrical rod was inserted consisting of six rectangular hooks. Hooks were positioned in such a way that each of them just touched the two bimorphs on either side in a particular row. The resonance frequency and capacitance for each bimorph was measured to be 65 Hz and 170 nF, respectively. The displacement of the bimorph under the maximum stress was equal to the height of the cam.

As wind flows across the generator it created a rotary motion on the attached fan which was converted into vertical motion of the cylindrical rod using the cam-shaft mechanism. This vertical motion of the cylindrical rod created oscillating stress on the bimorphs due to attached hooks. As the bimorph pressed against the rectangular hook it produces charge through direct piezoelectric effect. Thus, continuous back and forth oscillation of bimorph will continuously generate electricity. The cylindrical rod bearings were designed to be with very low friction. The rectangular body with bimorph transducers and cylindrical rod was mounted on a central rotating shaft. At one end of the shaft, fan blades were attached causing the shaft to rotate by the motion of the wind. The oscillating stress generated from the rotation of the fan is transferred to the cylindrical rod by using a cam of height 4 mm. The bimorphs produce output voltage proportional to the applied oscillating stress through piezoelectric effect. The prototype fabricated in this study was found to generate 1.2 mW power at a wind speed of 8.4 mph across a load of 1.7 kΩ.

Before the operation of the generator, bimorphs were prestressed to have a bending of 0.77 mm at the tip touching the hooks. Output power increased with the pre stress level; the pre stress level was adjusted such that the fan could be rotated easily in the normal wind flow conditions. Characterization of the generator was performed by blowing wind using a fan. Wind speed was measured using EA-3010U anemometer fitted at the top of the mill. The voltage was monitored on the HP 54601A digital 4-channel oscilloscope using HP 10071A probe. The impedance measurements were done using the HP 4194A analyzer. The capacitance and dielectric loss factor as a function of frequency was measured using HP 4275 LCR meter.

The effective electromechanical coupling factor ($k_{eff}$) of the generator in the free condition can be computed using the following relationship:

$$k_{eff} = \sqrt{1 - \left(\frac{f_r}{f_a}\right)^2}, \quad (10)$$

where $f_r$ and $f_a$ are resonance and anti-resonance frequencies. Using the values of $f_r$=669.25 Hz and $f_a$=743.5 Hz the magnitude of $k_{eff}$ was found to be 0.43. In the stressed condition, all the peaks in the resonance spectrum decreased significantly indicating the suppression of the vibration modes. At lower frequencies of less than 500 Hz, no peaks were observed in the impedance curve. In addition to $k_{eff}$, the other important parameters to be considered for the electromechanical transducer/actuator structure are dielectric loss factor (tan δ) and energy transmission coefficient, λ. At low frequencies, the loss of tan δ and capacitance was of the order of 2%. The loss was lower in the stressed condition as compared to free condition. The capacitance behavior as a function of the frequency showed a very discontinuous behavior, possibly related to the presence of mechanical vibration modes.

The electromechanical coupling factor represents the square root of the ratio of the stored mechanical energy over input electrical energy. On the other hand, λ is the ratio of the mechanical output energy over input electrical energy or the electrical output energy over input mechanical energy, and it is a significant parameter for actuators. The relation between the electromechanical coupling factor and the maximum transmission coefficient is given by:

$$\lambda_{max} = \left(\frac{1}{k} - \sqrt{\frac{1}{k^2} - 1}\right)^2. \quad (11)$$

Using the magnitude of $k_{eff}$ as 0.43, the value of $\lambda_{max}$ was found to be 0.05. The efficiency (η) of the transducer, governed by the mechanical and dielectric losses, is given by the relation:

$$\eta = \frac{\text{Output Electrical energy}}{\text{ConsumedInput Mechanical energy}}. \quad (12)$$

With a piezoelectric ceramic composition of the present invention, the efficiency usually reached was 95%. For a typical mechanical vibration cycle, the input mechanical energy is transformed into electrical energy with the ratio depending upon the square of the electromechanical coupling factor (0.185 in the present case), and the remainder unconsumed energy is stored as mechanical energy with a slight dissipated energy as heat. However, the actual efficiency is less since not all harvested energy is transformed into electrical energy.

With the generator described above, the voltage level and signal waveform depend on the design parameters and electric load used in the circuit. The average power across a resistor (R) was calculated using the relation $V^2/(2.R)$. At the frequency of 8 Hz and matching load of 670 Ω, the generated electrical power was found to be 0.96 mW.

At a given wind speed the frequency of the oscillation saturated and the power attained a constant magnitude. The power increased with increasing wind speed which is related to the increment in the frequency. The variation of the power as a function of the frequency was linear variation, which is when a bimorph at low frequencies behaves like a capacitor. The cut-in wind speed (threshold wind speed required to start the windmill) was found to be 4.7 mph and cut-out wind speed (maximum wind speed above which structural problems may occur) was found to be 14 mph. The rated wind speed was found to be 12 mph providing a constant power of 1.2 mW demonstrating the effectiveness of this small-scale piezoelectric generator.

As before, the electrical energy generated by the generator described herein may be stored in, for example, the capacitor or miniaturized Li-batteries. The generated energy is then available to power an of a number of items requiring power, such as sensing, optical, and electrical devices. The power is readily controlled by adjusting the number of bimorph actuators in the generator.

In still another example, compositions of the present invention provide for piezoelectric transformers, such as multilayer piezoelectric transformers that have one direction poling (are unipoled) or more than one direction poling. The transformers may operate in a wide-frequency range and deliver both step-up and step-down voltages with high power. In one example, piezoelectric ceramic compositions of the present invention may be fabricated as transformer, such as disks of diameter 29.1 mm for lighting lamps up to 10 W and 40 mm for lighting the lamp of 32 W. The electrode pattern is a ring/dot structure, where a strip connects the dots. In one form, the transformer works in the fundamental radial mode to yield high power and efficiency. Such a transformer with optimized electrode pattern may provide a power density of at least about 40 W/cm. Multilayering of the unipoled transformers may be equivalent to connecting the transformer in parallel.

While particular embodiments of the invention and method steps of the invention have been described herein, additional alternatives not specifically disclosed but known in the art are intended to fall within the scope of the invention. Thus, it is understood that other embodiments and applications of the present invention will be apparent to those skilled in the art without departing from the scope and spirit of the appended claims and drawings.

What is claimed is:

1. A composition consisting of:
a ceramic material of the formula $Pb[(Zr_{0.52}Ti_{0.48})O_3]_{1-x}[(Zn_{1/3}Nb_{2/3})O_3]_x + Mn$,
wherein Pb is lead, Zr is zirconium, Ti is titanium, O is oxygen, Nb is niobium, Mn is manganese that is present in various forms at 0.7 wt %, and x is 0.1, wherein the ceramic material includes an energy density of $16168 \times 10^{-15}$ m$^2$/N.

2. The composition of claim 1, wherein the composition provides a product ($d_{33} \cdot g_{33}$) of the piezoelectric voltage constant ($g_{33}$) and piezoelectric stress constant ($d_{33}$) that is significantly higher than those obtained from conventional hard or soft ceramics.

3. The composition of claim 2, wherein the piezoelectric voltage constant ($g_{33}$) is at least about $50 \times 10^{-3}$ m$^2$/C.

4. The composition of claim 2, wherein piezoelectric stress constant ($d_{33}$) is at least about 280 pC/N.

5. The composition of claim 2, wherein the composition includes a density greater approximately 98% of the theoretical density.

6. The composition of claim 1, wherein the microstructure is polycrystalline.

7. The composition of claim 1, wherein the composition has a high energy density as defined by $|d| = \epsilon^n$ by the reduction of the magnitude of a constant n to 1.151 when manganese is at a wt % of 0.7%.

8. The composition of claim 1, wherein the piezo electric voltage constant ($g_{33}$) constant is about 55.56, the piezoelectric stress constant ($d_{33}$) is 291pC/N, and manganese is at a wt % of 0.7.

9. A method of preparing a ceramic material comprising:
heating a ceramic material to a first temperature that is above 900 degrees Centigrade for at least five minutes;
dropping the first temperature to a second temperature by at least 25 degrees to over 100 degrees;
holding the second temperature for at least about 4 hours producing a polycrystalline ceramic material having small grains and a dense microstructure; and
wherein the ceramic material consists of $Pb[(Zr_{0.52}Ti_{0.48})O_3]_{1-x}[(Zn_{1/3}Nb2_{/3})O_3]x + Mn$, wherein Pb is lead, Zr is zirconium, Ti is titanium, O is oxygen, Nb is niobium, Mn is manganese that is present in various forms at 0.7 wt %, and x is 0.1 and the ceramic material includes an energy density of $16168 \times 10^{-15}$ m$^2$/N.

10. The method of claim 9, wherein the first temperature is 1000° C. and the second temperature is about 925° C.; thereby producing a polycrystalline ceramic material including small grains and a dense microstructure with a high energy density.

11. The method of claim 9, wherein a first temperature is obtained at a rate of three degrees per Centigrade per minute and a second temperature is obtained at a rate of seven degrees per Centigrade per minute.

12. The method of claim 9, wherein the n coefficient of the equation $|d| = \epsilon^n$ is 1.151 when manganese is at a wt % of 0.7 to obtain an enhancement in the magnitude of the g constant.

13. The method of claim 9, wherein the first temperature is 950° C. and the second temperature is about 900° C.

14. The method of claim 9, wherein the first temperature is 1050° C. and the second temperature is about 950° C.

15. The composition of claim 1, wherein piezoelectric stress constant ($d_{33}$) is equal to 291 pC/N and the dielectric constant of $\epsilon_{33}/\epsilon_o$ is 591.55.

16. The composition of claim 1, wherein the composition includes a grain size of 1.75 μm.

17. The method of claim 9, wherein the ceramic material includes a grain size of 1.75 μm.

* * * * *